(12) United States Patent
Lee

(10) Patent No.: US 8,022,313 B2
(45) Date of Patent: Sep. 20, 2011

(54) CIRCUIT BOARD WITH ELECTROMAGNETIC BANDGAP ADJACENT OR OVERLAPPING DIFFERENTIAL SIGNALS

(75) Inventor: Jun-Ho Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 442 days.

(21) Appl. No.: 12/346,655

(22) Filed: Dec. 30, 2008

(65) Prior Publication Data

US 2009/0260864 A1    Oct. 22, 2009

(30) Foreign Application Priority Data

Apr. 16, 2008 (KR) .................. 10-2008-0035229

(51) Int. Cl.
*H05K 1/16* (2006.01)
(52) U.S. Cl. ...................................... 174/260
(58) Field of Classification Search .............. 174/260, 174/255, 360, 262, 204, 350; 333/204, 909, 333/240, 754, 700 MS; 361/818
See application file for complete search history.

(56) References Cited

U.S. PATENT DOCUMENTS

| 6,914,334 | B2 | 7/2005 | Li et al. | |
|---|---|---|---|---|
| 7,215,301 | B2 * | 5/2007 | Choi et al. | 343/909 |
| 7,253,788 | B2 * | 8/2007 | Choi et al. | 343/909 |
| 7,760,140 | B2 * | 7/2010 | Kamgaing | 343/700 MS |
| 7,764,149 | B2 * | 7/2010 | Han et al. | 333/204 |
| 2007/0090398 | A1 | 4/2007 | McKinzie | |
| 2007/0289771 | A1 | 12/2007 | Osaka et al. | |
| 2008/0264685 | A1 * | 10/2008 | Park et al. | 174/262 |
| 2009/0145646 | A1 * | 6/2009 | Han et al. | 174/260 |
| 2009/0236141 | A1 * | 9/2009 | Kim et al. | 174/360 |
| 2009/0322450 | A1 * | 12/2009 | Kim et al. | 333/204 |
| 2011/0067917 | A1 * | 3/2011 | Park et al. | 174/350 |

FOREIGN PATENT DOCUMENTS

| KR | 100275414 | 9/2000 |
|---|---|---|
| KR | 100275414 B1 | 9/2000 |
| KR | 100643408 | 10/2006 |
| KR | 100643408 B1 | 10/2006 |

* cited by examiner

*Primary Examiner* — Chandrika Prasad
(74) *Attorney, Agent, or Firm* — Baker & McKenzie LLP

(57) ABSTRACT

A circuit board includes a plurality of differential signal line pairs, and a plurality of electromagnetic bandgap (EBG) patterns, each configured to be disposed to overlap the plurality of differential signal line pairs, wherein the EBG patterns are electrically insulated from the differential signal line pairs.

39 Claims, 3 Drawing Sheets

US 8,022,313 B2

CIRCUIT BOARD WITH ELECTROMAGNETIC BANDGAP ADJACENT OR OVERLAPPING DIFFERENTIAL SIGNALS

CROSS-REFERENCES TO RELATED PATENT APPLICATION

The present application claims priority under 35 U.S.C 119(a) to Korean Application No. 10-2008-0035229, filed on Apr. 16, 2008, in the Korean Intellectual Property Office, which is incorporated herein by reference in its entirety as set forth in full.

BACKGROUND

1. Technical Field

The embodiments described herein relate to a semiconductor integrated circuit apparatus, and more particularly, to a circuit board having a semiconductor module mounted thereon.

2. Related Art

In general, a semiconductor package includes semiconductor chips mounted on a circuit board, such as a mother board or a printed circuit board (PCB) to constitute an integrated circuit module. Here, the circuit board includes an insulating substrate and a plurality of signal line layers that are disposed on the insulating substrate to provide electrical communications between the semiconductor chips.

As operational frequencies of semiconductor integrated apparatuses increase, ground bounce noise (GBN) has become important in semiconductor integrated circuit modules that include the semiconductor integrated apparatuses. For example, the GBN generates a resonance between adjacent power supply layers and signal line layers within the semiconductor integrated circuit modules, thereby causing electromagnetic interference (EMI) and degrading the electrical communications both to and from the semiconductor integrated circuit modules. Accordingly, a coupling capacitor is commonly incorporated into the semiconductor integrated circuit modules in order to suppress the GBN.

However, since the semiconductor integrated circuit module has a structure that is easily vulnerable to electrical noise, such as the GBN, it is difficult to provide for signal stability of signals that are transmitted through the signal lines disposed on the semiconductor integrated circuit module. In particular, if a clock signal, data signal, a command signal, and an address signal, which are signals commonly transmitted through the signal lines on the semiconductor integrated circuit module, are lost or distorted due to the electrical noise, normal operation of the semiconductor integrated apparatus is impossible.

SUMMARY

A circuit board and a semiconductor integrated circuit module including the circuit board capable of ensuring stable noise transmission are disclosed herein.

In one aspect, a circuit board includes a plurality of differential signal line pairs, and a plurality of electromagnetic bandgap (EBG) patterns, each configured to be disposed to overlap the plurality of differential signal line pairs, wherein the EBG patterns are electrically insulated from the differential signal line pairs.

In another aspect, a circuit board includes a plurality of signal line layers configured to include a plurality of differential signal line pairs that provide differential signal pairs to a semiconductor integrated circuit chip, a plurality of electromagnetic bandgap (EBG) patterns configured to be disposed adjacent to each of the plurality of differential signal line pairs, and a plurality of insulating layers configured to be disposed between the plurality of signal line layers and the plurality of EBG patterns.

In another aspect, a semiconductor integrated circuit module includes a circuit board, a memory control device configured to be mounted on the circuit board, and to generate and to output a plurality of differential signal pairs, a plurality of differential signal line pairs, each configured to be formed on the circuit board and to transmit a pair of the plurality of differential signal pairs, a semiconductor memory device configured to be mounted on the circuit board and to be supplied with the plurality of differential signal pairs transmitted along the plurality of differential signal line pairs; and a plurality of electromagnetic bandgap (EBG) patterns, each configured to be disposed in the circuit board and disposed at locations overlapping the plurality of differential signal line pairs.

In another aspect, a semiconductor integrated circuit module includes a plurality of differential signal line pairs, each configured to transmit differential signal pairs, an input buffer configured to compare the differential signal pairs transmitted from each of the plurality of differential signal line pairs and to perform a buffering operation of signals of the differential signal pairs, and a board configured to include a plurality of electromagnetic bandgap (EBG) patterns, wherein the plurality of differential signal line pairs are disposed on a first side of the board and the EBG patterns are provided on a second side of the board.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
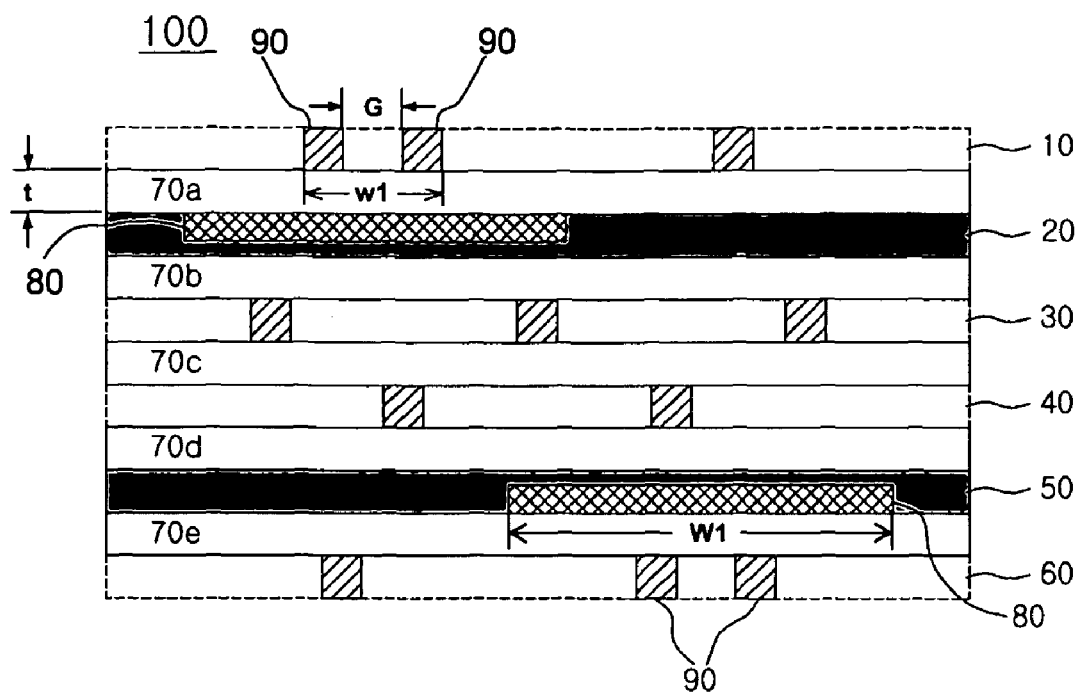
FIG. 1 is a cross-sectional view of an exemplary circuit board according to one embodiment.

FIG. 1 is a cross-sectional view of an exemplary circuit board according to one embodiment. In FIG. 1, a circuit board 100 can be configured to include a plurality of signal line layers 10, 30, 40, and 60, a plurality of power supply layers 20 and 50, a plurality of insulating layers 70a to 70e, a plurality of electromagnetic bandgap (EBG) patterns 80, and a plurality of differential signal line pairs 90.

The plurality of signal line layers 10, 30, 40, and 60 can be stacked having predetermined gaps, such that they are not electrically connected to each other. Although the circuit board 100 is shown in FIG. 1 to include the four signal line layers 10, 30, 40, and 60, the structure of the circuit board 10 can have more or less than the four signal line layers 10, 30, 40, and 60. Here, the uppermost signal line layer 10 and the lowermost signal line layer 60 can be exposed at exterior side portions of the circuit board 100. Alternatively, only portions of the uppermost signal line layer 10 and the lowermost signal line layer 60 can be exposed, i.e., uppermost signal line layer 10 and the lowermost signal line layer 60 can be partially covered with either additional signal line layers or component devices.

In FIG. 1, the plurality of power supply layers 20 and 50 can be configured to include the first and second power supply layers 20 and 50. For example, the first and second power supply layers 20 and 50 can each receive power from exterior portions of the circuit board 100, and/or can each transmit power through the circuit board 100. Here, the first and second power supply layers 20 and 50 can be interposed between the plurality of signal line layers 10, 30, 40, and 60 so as not to cause electrical interference with the plurality of signal line layers 10, 30, 40, and 60. In addition, although two power supply layers 20 and 50 are shown, additional power supply layers can be provided to transmit the same power as the first and second power supply layers 20 and 50 or to transmit a power different from the power transmitted by the first and second power supply layers 20 and 50.

Each of the first and second power supply layers 20 and 50 can be configured to include at least one of the electromagnetic bandgap (EBG) patterns 80. For example, the EBG patterns 80 can be configured to be buried within each of the first and second power supply layers 20 and 50. Here, an uppermost one of the EBG patterns 80 is shown to be provided along an interface between an uppermost one of the plurality of insulating layers 70a and the first power supply layer 20 adjacent to an uppermost one of the differential signal line pairs 90. Similarly, a lowermost one of the EBG patterns 80 is shown to be provided along an interface between a lowermost one of the plurality of insulating layers 70e and the second power supply layer 50 adjacent to a lowermost one of the differential signal line pairs 90. Here, use of the term uppermost and lowermost can be considered relative. However, the relative placement of the EBG patterns 80, the interfaces between the insulating layers and the power supply layers, and the differential signal line pairs does not necessarily change.

In addition, the EBG patterns 80 can be formed of a highly conductive material or materials, such as copper. Alternatively, the EBG patterns can be formed of various conductive materials, either as a homogeneous layer or as a multi-layered structure. For example, the EBG patterns 80 can be formed of copper sandwiched between barrier materials in order to prevent the copper from becoming diffused into the material(s) with which the first and second power supply layers 20 and 50 are formed. Moreover, the EBG patterns 80 can have multi-layered outermost structures completely surrounding and encapsulating the EBG patterns 80 in order to prevent diffusion into the plurality of insulating layers 70a to 70e, or into the plurality of differential signal line pairs 90.

Figure 2:
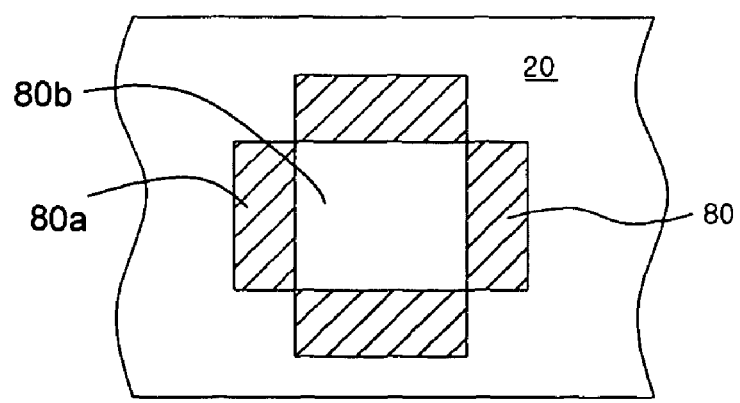
FIG. 2 is a plan view of an exemplary EBG pattern according to one embodiment.

FIG. 2 is a plan view of an exemplary EBG pattern according to one embodiment. In FIG. 2, each of the EBG patterns 80 can form a predetermined geometrical shape. For example, each of the EBG patterns 80 can include a plurality of sub-patterns 80a. Here, for example, the EBG patterns 80 are shown having rectangular sub-patterns 80a disposed together to form a cross-shaped geometry. Here, the EBG patterns 80 have an opening region 80b that can be surrounded by relative arrangement of the sub-patterns 80a. Alternatively, the EBG patterns 80 can be arranged to form other geometries using various sub-patterns, wherein each of the sub-patterns can be substantially identical or different from each other. Accordingly, each of the EBG pattern 80 can be used to function as an antenna and the like, and can effectively prevent electrical noise, such as ground bounce noise (GBN). In addition, the EBG patterns 80 can be formed by using a damascene method.

In FIG. 1, the EBG patterns 80 buried in the first and second power supply layers 20 and 50 can provide an impedance related to at least one of a resistor, an inductor, and a capacitor in the power supply layers 20 and 50. Accordingly, the EBG patterns 80 can each generate a coupling capacitor between adjacent signal line layers 10, 30, 40, and 60 and the first and second power supply layers 20 and 50. However, the EBG patterns 80 can be provided in layered structures other than, or in addition to, the first and second power supply layers 20 and 50.

Figure 3:
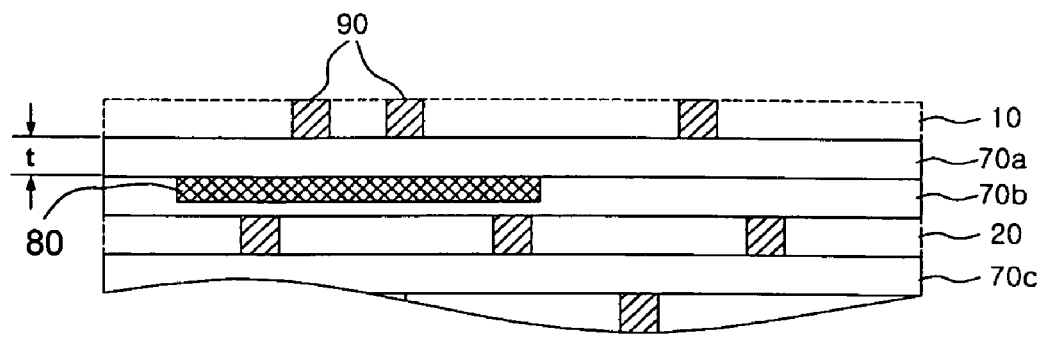
FIG. 3 is a cross-sectional view of a main portion of an exemplary circuit board according to another embodiment.

FIG. 3 is a cross-sectional view of a main portion of an exemplary circuit board according to another embodiment. In FIG. 3, the EBG patterns 80 can be formed some of the plurality of insulating layers 70a to 70e, instead of the first and second power supply layers 20 and 50 (in FIG. 1). For example, the EBG pattern 80 is provided within a second one of the plurality of insulating layers 70b along an interface between the second one of the plurality of insulating layers 70b and a first one of the plurality of insulating layers 70a adjacent to one of the differential signal line pairs 90. Accordingly, the EBG pattern 80 can be in an electrically floating state, i.e., no specific electrical bias. Here, the EBG patterns 80 can be effected by the signals transmitted along the differential signal line pairs 90, wherein a capacitor can be formed by the signals transmitted along the differential signal line pair 90 and a corresponding one of the EBG patterns 80.

In each of FIGS. 1 and 3, the EBG patterns 80 are preferably disposed to overlap the differential signal line pairs 90. Moreover, each of the EBG patterns 80 are disposed to be as close as possible to a corresponding one of the differential signal line pairs 90 with at least a portion of one of the plurality of insulating layers 70a to 70e being disposed there between. For example, as shown in FIGS. 1 and 3, a full thickness "t" of the insulating layer 70a is provided between the EBG pattern 80 and the differential signal line pair 90. Alternatively, more or less than the full thickness of the insulating layer 70a can be provided between the EBG pattern 80 and the differential signal line pair 90.

In FIGS. 1 and 3, relative placement of each of the EBG patterns 80 with each of the differential signal line pairs 90 provides for compensation of signal loss by the EBG patterns 80. Accordingly, signals transmitted along the differential signal line pair 90 can be stabilized. For example, the placement of the uppermost one of the EBG patterns 80 with regard to the uppermost ones of the differential signal line pairs 90 can compensate for loss of signal strength transmitted along the uppermost ones of the differential signal line pairs 90. Likewise, the placement of the lowermost one of the EBG patterns 80 with regard to the lowermost ones of the differential signal line pairs 90 can compensate for loss of signal strength transmitted along the lowermost ones of the differential signal line pairs 90. Accordingly, signals transmitted along the differential signal line pairs 90 can be stabilized.

In FIG. 1, each of the EBG patterns 80 can have a width "W1" that can be about two to about six times wider than a total length of a gap "G" between the differential signal line pair 90 and a line width "w1" of the differential signal line pair 90. However, a critical length exists when the EBG pattern 80 has a width "W1" that is about three times wider than the line width "w1" of the differential signal line pair 90. Here, providing the EBG pattern 80 having a width "W1" that is about three times wider than the line width "w1" of the differential signal line pair 90 can minimize signal loss of signals transmitted along the differential signal line pair 90. Accordingly, it is preferable to form the EBG patterns 80 having the relationship of:

$$W1 \cong 3 \times w1$$

In FIGS. 1 and 3, the plurality of insulating layers 70a to 70e can be interposed between each of the signal line layers 10, 30, 40, and 60, respectively, and between the signal line layers 10, 30, 40, and 60 and the first and second power supply layers 20 and 50, thereby electrically insulating the signal line layers from each other and the signal line layers from the power supply layers.

Figure 4:
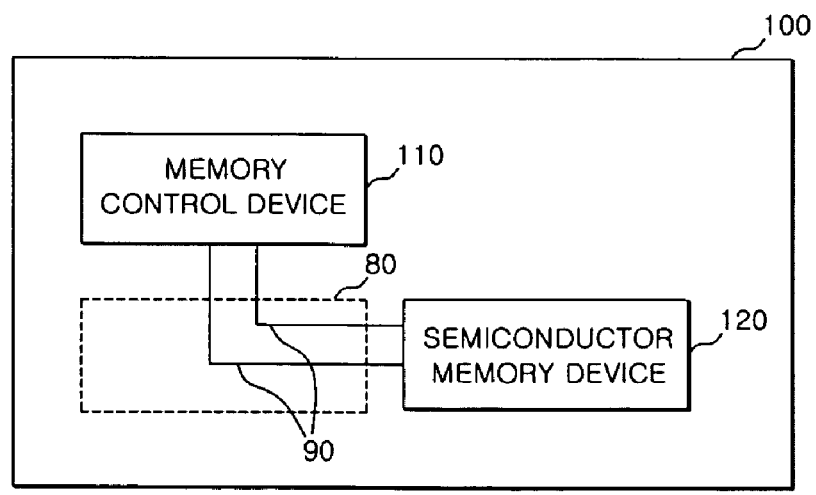
FIG. 4 is a schematic diagram of an arrangement relationship of an integrated circuit module according to one embodiment.

FIG. 4 is a schematic diagram of an arrangement relationship of an integrated circuit module according to one embodiment. In FIG. 4, an integrated circuit module 200 can be configured to include a circuit board 100, a memory control device 110, which can be disposed on the circuit board 100, a semiconductor memory device 120, and a differential signal line pair 90.

The memory control device 110 and the semiconductor memory device 120 can be connected to each other by the differential signal line pair 90, and the semiconductor memory device 120 can be supplied with differential signals transmitted along the differential signal line pair 90. In addition, an EBG pattern 80 can be disposed below an area where the differential signal line pair 90 is disposed. Although FIG. 4 shows an arrangement where the memory control device 110 is disposed perpendicular to the semiconductor memory device 120, other configuration can be implemented while still having the benefit of the EBG pattern 80.

In FIG. 4, the memory control device 110 can provide signals input to the semiconductor memory device 120 transmitted along the differential signal line pair 90. For example, the input signals can include a clock pair signal, data pair signals, command pair signals, and address pair signals.

In FIG. 4, if all signal lines that transmit the signals with a semiconductor integrated apparatus are implemented in a form of the differential signal line pair 90, then the EBG pattern 80 can have an area that substantially corresponds to an area of the entire circuit board 100. Here, even though the EBG pattern 80 is shown to be provided below the memory control device 110 and the semiconductor memory device 120, internal circuits of the memory control device 110 and the semiconductor memory device 120 are not electrically affected.

Figure 5:
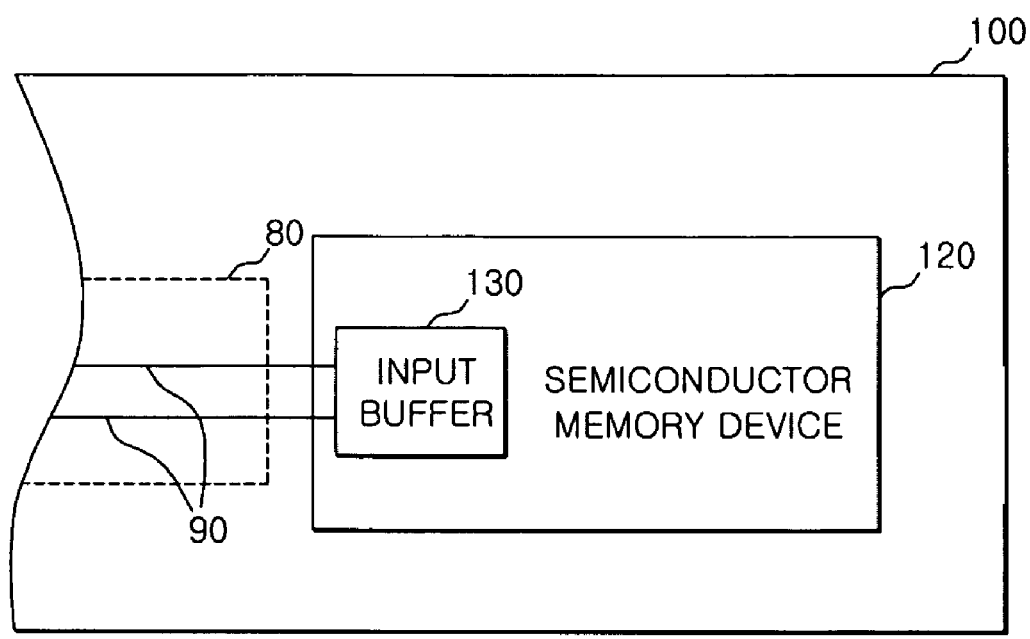
FIG. 5 is a partially enlarged plan view of FIG. 4 according to one embodiment.

FIG. 5 is a partially enlarged plan view of FIG. 4 according to one embodiment. In FIG. 5, the EBG pattern 80 can be provided below the differential signal line pair 90. Alternatively, the EBG pattern 80 can be provided above the differential signal line pair 90. In either exemplary configuration, the EBG pattern is provided adjacent to the differential signal line pair, as shown in FIG. 1. Accordingly, the semiconductor memory device 120 can be configured to include an input buffer 130 that can compare the differential signal pair transmitted along the differential signal line pair 90, and can buffer the differential signal pair. For example, the input buffer 130 can be a buffer that does not compare the differential signal pair with a reference voltage but compares each of the dissimilar signals of the differential signal pair and performs a buffering operation of the dissimilar signals.

In FIG. 4, since the semiconductor integrated circuit module 200 can include the EBG pattern 80 provided on or in the first and second power supply layer 20 and 50 below/above the differential signal line pair 90, influence of electrical noise upon the signals transmitted along the differential signal line pair, such as the GBN, can be reduced. Accordingly, the semiconductor integrated apparatus can be prevented from becoming unstable due to influences of electromagnetic interference, by reducing noise that can cause signal loss of the signals input to or output from a semiconductor integrated circuit module.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A circuit board, comprising:
    a plurality of differential signal line pairs; and
    a plurality of electromagnetic bandgap (EBG) patterns, each configured to be disposed to overlap the plurality of differential signal line pairs,
    wherein the EBG patterns are electrically insulated from the differential signal line pairs.

2. The circuit board of claim 1, further comprising a plurality of insulating layers, each configured to be interposed between the plurality of differential signal line pairs and the plurality of EBG patterns.

3. The circuit board of claim 2, wherein an uppermost one of the plurality of EBG patterns is provided within a second one of the plurality of insulating layers and spaced apart from one of the plurality of differential signal line pairs by a first one of the plurality of insulating layer.

4. The circuit board of claim 3, wherein the uppermost one of the plurality of EBG patterns is provided along an interface between the second one of the plurality of insulating layers and the first one of the plurality of insulating layers.

5. The circuit board of claim 2, wherein an lowermost one of the plurality of EBG patterns is provided within a next to last one of the plurality of insulating layers and spaced apart from a second one of the plurality of differential signal line pairs by a last one of the plurality of insulating layer.

6. The circuit board of claim 5, wherein the lowermost one of the plurality of EBG patterns is provided along an interface between the next to last one of the plurality of insulating layers and the last one of the plurality of insulating layers.

7. The circuit board of claim 1, further comprising a plurality of signal line layers configured to include the plurality of differential signal line pairs.

8. The circuit board of claim 1, further comprising a plurality of power supply layers configured to include the plurality of EBG patterns.

9. The circuit board of claim 8, wherein an uppermost one of the plurality of EBG patterns is provided along an interface between an uppermost one of the plurality of insulating layers and an uppermost one of the plurality of power supply layers adjacent to an uppermost one of the plurality of differential signal line pairs.

10. The circuit board of claim 9, wherein a lowermost one of the plurality of EBG patterns 80 is provided along an interface between a lowermost one of the plurality of insulating layers and a lowermost one of the plurality of power supply layers adjacent to a lowermost one of the plurality of differential signal line pairs.

11. The circuit board of claim 1, wherein each of the plurality of EBG patterns are configured to have a width that is about two to about six times wider than a total length of a gap between signal lines of each of the plurality of differential signal line pairs and a line width of each of the plurality of differential signal line pairs.

12. The circuit board of claim 11, wherein each of the plurality of EBG patterns are configured to have a width that is about three times wider than the line width of each of the plurality of differential signal line pairs.

13. The circuit board of claim 1, wherein each of the plurality of EBG patterns include conductive material.

14. The circuit board of claim 13, wherein each of the plurality of EBG patterns include copper.

15. A circuit board, comprising:
a plurality of signal line layers configured to include a plurality of differential signal line pairs that provide differential signal pairs to a semiconductor integrated circuit chip;
a plurality of electromagnetic bandgap (EBG) patterns configured to be disposed adjacent to each of the plurality of differential signal line pairs; and
a plurality of insulating layers configured to be disposed between the plurality of signal line layers and the plurality of EBG patterns.

16. The circuit board of claim 15, wherein an uppermost one of the plurality of EBG patterns is provided within a second one of the plurality of insulating layers and spaced apart from an uppermost one of the plurality of differential signal line pairs by a first one of the plurality of insulating layers.

17. The circuit board of claim 16, wherein the uppermost one of the plurality of EBG patterns is provided along an interface between the second one of the plurality of insulating layers and the first one of the plurality of insulating layers.

18. The circuit board of claim 15, wherein an lowermost one of the plurality of EBG patterns is provided within a next to last one of the plurality of insulating layers and spaced apart from a lowermost one of the plurality of differential signal line pairs by a last one of the plurality of insulating layers.

19. The circuit board of claim 18, wherein the lowermost one of the plurality of EBG patterns is provided along an interface between the next to last one of the plurality of insulating layers and the last one of the plurality of insulating layers.

20. The circuit board of claim 15, further comprising a plurality of power supply layers that supply power to the semiconductor integrated circuit chip.

21. The circuit board of claim 20, wherein each of the plurality of EBG patterns are configured to be provided in the plurality of power supply layers.

22. The circuit board of claim 21, wherein an uppermost one of the plurality of EBG patterns is provided along an interface between an uppermost one of the plurality of insulating layers and an uppermost one of the plurality of power supply layers adjacent to an uppermost one of the plurality of differential signal line pairs.

23. The circuit board of claim 22, wherein a lowermost one of the plurality of EBG patterns is provided along an interface between a lowermost one of the plurality of insulating layers and a lowermost one of the plurality of power supply layers adjacent to a lowermost one of the plurality of differential signal line pairs.

24. The circuit board of claim 15, wherein each of the plurality of EBG patterns are configured to have a width that is about two to about six times wider than a total length of a gap between signal lines of each of the plurality of differential signal line pairs and a line width of each of the plurality of differential signal line pairs.

25. The circuit board of claim 24, wherein each of the plurality of EBG patterns are configured to have a width that is about three times wider than the line width of each of the plurality of differential signal line pairs.

26. The circuit board of claim 15, wherein each of the plurality of EBG patterns include conductive material.

27. The circuit board of claim 26, wherein each of the plurality of EBG patterns include copper.

28. A semiconductor integrated circuit module, comprising:
a circuit board;
a memory control device configured to be mounted on the circuit board, and to generate and to output a plurality of differential signal pairs;
a plurality of differential signal line pairs, each configured to be formed on the circuit board and to transmit a pair of the plurality of differential signal pairs;
a semiconductor memory device configured to be mounted on the circuit board and to be supplied with the plurality of differential signal pairs transmitted along the plurality of differential signal line pairs; and
a plurality of electromagnetic bandgap (EBG) patterns, each configured to be disposed in the circuit board and disposed at locations overlapping the plurality of differential signal line pairs.

29. The semiconductor integrated circuit module of claim 28, wherein each of the plurality of EBG patterns are configured to have a width that is about two to about six times wider than a total length of a gap between signal lines of each of the plurality of differential signal line pairs and a line width of each of the plurality of differential signal line pairs.

30. The semiconductor integrated circuit module of claim 29, wherein each of the plurality of EBG patterns are configured to have a width that is about three times wider than the line width of each of the plurality of differential signal line pairs.

31. The semiconductor integrated circuit module of claim 28, wherein each of the plurality of EBG patterns include conductive material.

32. The semiconductor integrated circuit module of claim 31, wherein each of the plurality of EBG patterns include copper.

33. The semiconductor integrated circuit module of claim 28, wherein each of the plurality of differential signal pairs is configured to include at least one of a clock signal pair, a data signal pair, a command signal pair, and an address signal pair.

34. A semiconductor integrated circuit module, comprising:
a plurality of differential signal line pairs, each configured to transmit differential signal pairs;
an input buffer configured to compare the differential signal pairs transmitted from each of the plurality of differential signal line pairs and to perform a buffering operation of signals of the differential signal pairs; and
a board configured to include a plurality of electromagnetic bandgap (EBG) patterns,
wherein the plurality of differential signal line pairs are disposed on a first side of the board and the EBG patterns are provided on a second side of the board.

35. The semiconductor integrated circuit module of claim 34, wherein each of the plurality of EBG patterns are configured to have a width that is about two to about six times wider than a total length of a gap between signal lines of each of the plurality of differential signal line pairs and a line width of each of the plurality of differential signal line pairs.

36. The semiconductor integrated circuit module of claim 35, wherein each of the plurality of EBG patterns are configured to have a width that is about three times wider than the line width of each of the plurality of differential signal line pairs.

37. The semiconductor integrated circuit module of claim 34, wherein each of the plurality of EBG patterns include conductive material.

38. The semiconductor integrated circuit module of claim 37, wherein each of the plurality of EBG patterns include copper.

39. The semiconductor integrated circuit module of claim 34, wherein the differential signal pairs is configured to include at least one of a clock signal pair, a data signal pair, a command signal pair, and an address signal pair.

* * * * *